United States Patent [19]
Han et al.

[11] Patent Number: 6,017,785
[45] Date of Patent: Jan. 25, 2000

[54] METHOD FOR IMPROVING LATCH-UP IMMUNITY AND INTERWELL ISOLATION IN A SEMICONDUCTOR DEVICE

[75] Inventors: Chung-Chyung Han, San Jose; Jeong Yeol Choi, Fremont; Cheun-Der Lien, Los Altos Hills, all of Calif.

[73] Assignee: Integrated Device Technology, Inc., Santa Clara, Calif.

[21] Appl. No.: 08/698,675

[22] Filed: Aug. 15, 1996

[51] Int. Cl.[7] .................................................. H01L 21/8238
[52] U.S. Cl. ........................ 438/199; 438/217; 438/223; 438/224; 438/225; 438/226; 438/227; 438/228; 438/531; 438/981
[58] Field of Search ..................... 438/199, 217, 438/223, 224, 225, 226, 227, 228, 531, 981, FOR 613, FOR 205, FOR 216, FOR 217, FOR 218, FOR 240; 148/DIG. 163

[56] References Cited

U.S. PATENT DOCUMENTS

| | | | |
|---|---|---|---|
| 4,346,512 | 8/1982 | Liang et al. | 29/571 |
| 4,710,477 | 12/1987 | Chen | 437/34 |
| 4,721,686 | 1/1988 | Contiero et al. | 437/31 |
| 4,920,066 | 4/1990 | Hong et al. | 437/57 |
| 4,947,227 | 8/1990 | Teng | 357/42 |
| 4,975,764 | 12/1990 | Hsu | 357/43 |
| 5,028,556 | 7/1991 | Chang | 437/57 |
| 5,247,200 | 9/1993 | Momose et al. | 257/378 |
| 5,362,981 | 11/1994 | Sato et al. | 257/371 |
| 5,408,125 | 4/1995 | Erdeljac et al. | 257/607 |
| 5,501,993 | 3/1996 | Borland | 437/34 |
| 5,679,586 | 10/1997 | Rodrigues et al. | 148/DIG. 163 |
| 5,744,372 | 4/1998 | Bulucea | 437/34 |

FOREIGN PATENT DOCUMENTS

| | | | |
|---|---|---|---|
| 000250722 | 1/1988 | European Pat. Off. | 438/FOR 217 |
| 353010282 | 1/1978 | Japan | 438/FOR 163 |
| 353031978 | 3/1978 | Japan | 438/FOR 163 |
| 353125781 | 11/1978 | Japan | 438/FOR 163 |
| 353138685 | 12/1978 | Japan | 438/FOR 163 |

(List continued on next page.)

OTHER PUBLICATIONS

Toshiki Yabu et al., "An Advanced Half–Micrometer CMOS Device with Self–Aligned Retrograde Twin–Wells and Buried p$^+$ Layer," *VLSI Technology Symposium*, pp. 35–36 (1989).

Photocopy of materials presented at a seminar hosted by Genus, Inc. on Jul. 12, 1995 in San Francisco, California entitled, "Manufacturing Issues (Process & Equipment) in MeV Implantation", John O. Borland.

Hayden, James D. et al., "A High–Performance Half–Micrometer Generation CMOS Technology for Fast SRAM's", *IEEE Transactions on Electron Devices* 38:876–884 (1991).

Lewis, Alan G. et al., "Latchup Performance of Retrograde and Conventional n–Well CMOS Technologies", *IEEE Transactions on Electron Devices* 34:2156–2163 (1987).

*Primary Examiner*—Wael Fahmy
*Assistant Examiner*—Long Pham
*Attorney, Agent, or Firm*—Skjerven Morrill MacPherson Franklin & Friel

[57] ABSTRACT

A method of improving latch-up immunity and interwell isolation in a semiconductor device is provided. In one embodiment, an implant mask which has a variable permeability to implanted impurities is formed on the surface of a substrate having a first dopant region. A first portion of the implant mask overlies a first portion of the first dopant region. The structure is subjected to high energy implantation which forms a heavily doped region. A first portion of the heavily doped region is located along the lower boundary of the first dopant region. A second portion of the heavily doped region which extends along a side boundary of the first dopant region is formed by impurity ions which pass through the first portion of the implant mask. The heavily doped region improves latch-up immunity and interwell isolation without degrading threshold voltage tolerance. In alternative embodiments, one variable permeability mask is used to form the first dopant region and also to form the heavily doped region continuous with the first dopant region.

31 Claims, 11 Drawing Sheets

FOREIGN PATENT DOCUMENTS

| | | | |
|---|---|---|---|
| 356048168 | 5/1981 | Japan | 438/FOR 162 |
| 358097857 | 6/1983 | Japan | 438/FOR 217 |
| 359061059 | 4/1984 | Japan | 438/FOR 163 |
| 360066461 | 4/1985 | Japan | 438/FOR 442 |
| 360089966 | 5/1985 | Japan | 438/FOR 163 |
| 361174667 | 8/1986 | Japan | 438/FOR 163 |
| 362120018 | 6/1987 | Japan | 438/FOR 162 |
| 402020027 | 1/1990 | Japan | 438/FOR 163 |
| 405267206 | 10/1993 | Japan | 438/FOR 442 |

METHOD FOR IMPROVING LATCH-UP IMMUNITY AND INTERWELL ISOLATION IN A SEMICONDUCTOR DEVICE

CROSS REFERENCE TO RELATED APPLICATION

This application is related to Han et al., co-filed application Ser. No. 08/698,673, now U.S. Pat. No. 5,831,313 which issued on Nov. 3, 1998, therefore which is incorporated herein by reference in its entirety.

FIELD OF THE INVENTION

This invention relates generally to semiconductor devices and more particularly to a method for improving latch-up immunity and interwell isolation in a semiconductor device.

BACKGROUND OF THE INVENTION

As complementary metal oxide silicon (CMOS) devices are scaled down to have feature sizes below 0.5 micrometers ($\mu$m), several considerations become increasingly important.

One important consideration is latch-up. Latch-up is defined as a high current state which is triggered upon certain electrical excitations. The high current state generates heat which can cause failure of the semiconductor device. Thus, it is desirable to design semiconductor devices with latch-up immunity.

FIG. 1 is a cross-sectional view of a prior art semiconductor device 8 which is susceptible to latch-up. Semiconductor device 8 includes an n-type silicon substrate 10 having a p-well 12 and an n-well 14. P-well 12 and n-well 14 are separated by a boundary region 26. Formed within p-well 12 are n$^+$ source/drain regions 16, 18 and p$^+$ contact region 28 which is connected to a first voltage source $V_{ss}$ (typically ground). Formed within n-well 14 are p$^+$ source/drain regions 20, 22 and n$^+$ contact region 30 which is connected to a second voltage source $V_{DD}$ (typically 3.3 volts (V) or 5.0 V). A field oxide structure 24 is formed at the surface of substrate 10 overlying boundary region 26. Gate structures G1 and G2, each comprising, for example, a gate electrode and an underlying gate oxide layer, complete n-channel metal oxide semiconductor field effect transistor (MOSFET) 32 and p-channel MOSFET 34, respectively.

Latch-up occurs when parasitic bipolar transistors located within semiconductor device 8 are connected in a positive feedback loop. A parasitic vertical NPN bipolar transistor Q1 is formed by n-type source/drain regions 16, 18, p-well 12 and n-type substrate 10. A parasitic lateral NPN bipolar transistor Q2, which is formed in parallel with vertical NPN bipolar transistor Q1, is formed by n-type source/drain regions 16, 18, p-well 12 and n-well 14. A lateral parasitic PNP transistor Q3 is formed by p-type source/drain regions 20, 22, n-well 14 and p-well 12.

FIG. 2 is a diagram of the latch-up circuit of semiconductor device 8. Lateral NPN bipolar transistor Q2 is not shown for purposes of clarity. However, it is understood that lateral NPN bipolar transistor Q2 is in parallel with vertical NPN bipolar transistor Q1.

As shown in FIG. 2, the emitter of Q1 is coupled through a resistor R1 to the base of Q1. The emitter of Q3 is coupled through a resistor R2 to the base of Q3. The collector of Q1 is coupled to the base of Q3 and the collector of Q3 is coupled to the base of Q1.

Latch-up occurs when the voltage drop across resistor R2, hence the voltage drop between the emitter and base of Q3, is sufficient to turn Q3 on. This causes current flow between the emitter and collector of Q3. This produces a voltage drop across resistor R1, hence a voltage drop between the emitter and base of Q1. If the voltage drop between the emitter and base of Q1 is sufficient, then Q1 turns on. This causes current flow between the emitter and collector of Q1 which increases the current flow through resistor R2. This increases the voltage drop between the emitter and base of Q3. The positive feedback loop continues resulting in latch-up.

By decreasing the values of resistors R1 and R2, any tendency to forward bias (create a voltage drop between the emitter and base) parasitic bipolar transistors Q1, Q3 is reduced and latch-up immunity is improved. Although lateral parasitic NPN bipolar transistor Q2 is not shown in FIG. 2, it is understood that latch-up has both a vertical and lateral component. Thus to effectively suppress latch-up, both vertical and lateral latch-up must be suppressed.

One conventional method to suppress latch-up is to form a p-type heavily doped region at the lower portion of p-well 12. Referring to FIG. 3, a mask 40, made of photoresist, is formed overlying n-well 14 and partially overlying field oxide structure 24. As shown, the angle formed by the intersection of edge 40a of mask 40 and the top 24a of field oxide structure 24 is 90°. Mask 40 does not extend over p-well 12. The structure is then subjected to a high energy implant of a p-type impurity, shown as B$^+$ for boron. The p-type impurity does not pass through mask 40 into n-well 14. However, the p-type impurity is introduced into a region A of p-well 12 at a depth below the upper surface of n-type substrate 10.

Since higher concentrations of dopants improve conductivity, the heavily doped region A exhibits relatively high conductance (low resistance). Referring to FIG. 1, by forming a p-type heavily doped region (shown as A1) in p-well 12, vertical latch-up in parasitic vertical NPN bipolar transistor Q1 is inhibited. However, the heavily doped region A1 does not inhibit lateral latch-up under the field oxide structure 24 due to the parasitic lateral transistors Q2, Q3. As feature size in semiconductor devices is further reduced, lateral latch-up becomes increasingly important. Thus it is desirable to have a method of manufacturing a semiconductor device which inhibits both vertical and lateral latch-up.

Another important consideration in semiconductor technology is interwell isolation, i.e. it is important to prevent current leakage between the n-well and p-well. Interwell isolation can further be broken down into n-type source/drain region to n-well isolation (n$^+$ to n-well isolation) and p-type source/drain region to p-well isolation (p$^+$ to p-well isolation). As feature size in semiconductor devices is further reduced and the n$^+$ to n-well (and p$^+$ to p-well) spacing decreases, interwell isolation becomes increasingly important.

Hayden et al., "A high-performance half-micrometer generation semiconductor technology for fast SRAM's", *IEEE transactions on electron devices*, 38:877–878 (1991) discusses using a plug implant to improve interwell isolation. FIG. 4 illustrates the formation of a p-type plug 48 within p-well 12. As shown in FIG. 4, a mask (46, 46a) is patterned to expose a narrow slit 47 overlying p-well 12 near boundary region 26. A high energy boron implant is performed, which passes p-type impurities through field oxide 24, to form a p-type heavily doped plug 48 near boundary region 26.

The p-type heavily doped plug 48 improves n$^+$ to n-well isolation without significantly degrading p$^+$ to p-well isolation. However, the plug implant does not significantly improve latch-up because of vertical latch-up in parasitic vertical NPN bipolar transistor Q1. Further, the plug implant method limits the minimum spacing between n+ source/drain region 18 and p+ source/drain region 20 and requires an additional masking step, both of which are disadvantageous.

FIG. 5 illustrates the formation of a semiconductor device 49 having a Buried Implanted Layer for Lateral Isolation (BILLI). A photoresist mask 50 is patterned over a portion of a p-type substrate 48 and over a portion of field oxide structure 24. As shown, the angle of intersection between edge 50a of mask 50 and the top 24a of field oxide structure 24 is 90°. The structure is subjected to n-type impurity implantation(s) (not shown) to form n-well 52 (the n-type impurity does not pass through photoresist mask 50) and define p-well 12. The structure is then subjected to high energy implantation(s) using a p-type impurity, which passes p-type impurities through photoresist mask 50 into p-well 12 and also introduces p-type impurities into n-well 52 to form p-type dopant region 54. As shown, the portion 56 of dopant region 54 is located near the surface of p-well 12. The n-type source/drain regions are subsequently formed in portion 56 to form the n-channel MOSFET.

The dopant concentration in portion 56 determines the threshold voltage (the voltage applied to the gate at which the channel between the source and the drain becomes conductive) of the subsequently formed n-channel MOSFET, and hence semiconductor device 49. Since the dopant concentration in portion 56 depends upon the thickness of photoresist mask 50, the thickness of photoresist mask 50 determines the threshold voltage of semiconductor device 49. Since photoresists used to form photoresist mask 50 have poor conformality for different size devices (large variations in thickness depending upon the device dimensions), the BILLI method increases the tolerance for threshold voltage which is undesirable. (It is desirable to reduce any variation in threshold voltage between semiconductor devices, i.e. to reduce threshold voltage tolerances). Also, the BILLI method does not inhibit latch-up in parasitic lateral transistor Q2. In fact, the p-type dopant region 54 has a tendency to decrease the effective P+ to p-well spacing and thus enhances latch-up in parasitic lateral transistor Q2. Thus, the art needs a method for improving both vertical and lateral latch-up immunity and interwell isolation which does not have an adverse effect on threshold voltage tolerance.

SUMMARY OF THE INVENTION

In accordance with the invention, a method for improving latch-up immunity and interwell isolation in a semiconductor device is provided.

In one embodiment, an implant mask is formed on the upper surface of a substrate having a first dopant region of a first conductivity type and a second dopant region of a second conductivity type. The first and second dopant regions have lower boundaries located below the upper surface of the substrate. The first and second dopant regions also have side boundaries located adjacent one another at a boundary region between the first and second dopant regions. Each side boundary extends from the upper surface of the substrate to the lower boundary of the respective dopant region.

The implant mask has a first portion which overlies a first portion of the first dopant region near the boundary region. A second portion of the first dopant region is left exposed. The implant mask also has a second portion which overlies the second dopant region.

The structure is subjected to high energy implantation using a first conductivity type impurity to form a first heavily doped region with a substantially uniform dopant concentration greater than the dopant concentration of the first dopant region. The first heavily doped region comprises a first portion and a second portion. The first portion of the first heavily doped region extends along the lower boundary from the side boundary of the first dopant region and is formed by impurity ions which implant into the exposed second portion of the first dopant region.

The second portion of the first heavily doped region extends from the upper surface of the substrate along the side boundary of the first dopant region to the first portion of the first heavily doped region located at the lower boundary of the first dopant region. The second portion of the first heavily doped region is formed by impurity ions which pass through a portion of the implant mask as described below.

The implant mask has a variable thickness and hence variable permeability to implanted impurities. In particular, the second portion of the implant mask is relatively thick and the thickness is sufficient to prevent impurity ions from passing through the second portion of the implant mask and into the second dopant region. The first portion of the implant mask is relatively thin and allows impurity ions to pass through the implant mask and into the first portion of the first dopant region to form the second portion of the first heavily doped region.

The first portion of the implant mask can be formed with a variable thickness (and hence variable permeability) by forming the first portion of the implant mask with a sloped surface. Impurity ions which enter the sloped surface and pass through relatively thick portions of the implant mask lose a substantial amount of implant energy and as a consequence have a shallow implant depth into the first portion of the first dopant region. Conversely, impurity ions which enter the sloped surface and pass through relatively thin portion of the implant mask retain most of the implant energy and as a consequence are implanted relatively deep into the first portion of the first dopant region. As a result, the second portion of the first heavily doped region extends from the upper surface of the substrate along the side boundary of the first dopant region to the first portion of the first heavily doped region located at the lower boundary of the first dopant region.

In accordance with the invention, the implant mask with the sloped surface can be formed using a variety of techniques. In one embodiment, photoresist is deposited and patterned on the substrate to form a photoresist mask which has a substantially perpendicular side. The substrate and photoresist mask are then heated to a temperature which causes the side of the photoresist mask to deform and create the sloped surface of the implant mask. Other techniques include defocusing the light used to pattern the photoresist.

Alternatively, the sloped surface of the implant mask is formed by first depositing an oxide layer on the substrate and then depositing and patterning photoresist on the oxide layer. The exposed portion of the oxide layer is then etched isotropically creating an oxide implant mask with a sloped surface. The photoresist is then stripped.

The first heavily doped region improves both vertical and lateral latch-up immunity. The first heavily doped region exhibits reduced resistivity compared to the first dopant region. By reducing the resistivity, the gain of vertical and lateral parasitic bipolar transistors formed in the first dopant region is reduced which improves both vertical and lateral latch-up immunity.

The first heavily doped region also improves interwell isolation by restricting current flow across the boundary region between the first and second dopant regions. Further, threshold voltage tolerances are maintained since the high energy implantation does not significantly affect the dopant concentration near the surface of either the first dopant region or the second dopant region. Thus, the present invention provides a method for improving latch-up immunity and interwell isolation without degrading threshold voltage tolerances.

In accordance with an alternative embodiment of the present invention a variable permeability implant mask is formed by depositing two layers and patterning them differently. In one embodiment, a first layer is deposited on the substrate. Photoresist is deposited and patterned on the first layer to form a photoresist mask. The photoresist mask overlies the second dopant region and overlies the first portion of the first dopant region located near the boundary region. The exposed first layer is then removed by performing an anisotropic etch followed by an isotropic over etch leaving the portion of the photoresist mask which overlies the first portion of the first dopant region overhanging.

In an alternative embodiment, photoresist is deposited on the first layer and patterned as described above to form a photoresist mask. The first layer is then etched anisotropically to form a patterned first layer. A portion of the photoresist mask is then removed thereby exposing a portion of the patterned first layer which overlies the first portion of the first dopant region.

In both embodiments, the resulting structure is subjected to high energy implantation to form the first heavily doped region. The impurity ions do not pass through regions where the implant mask comprises both the first layer and the photoresist mask and therefore do not implant into the second dopant region. However, the impurity ions do pass through the overhanging photoresist mask (or the exposed portion of the patterned first layer) and into the first portion of the first dopant region to form the second portion of the first heavily doped region which extends from the upper surface of the substrate along the side boundary of the first dopant region to the first portion of the first heavily doped region located at the lower boundary of the first dopant region.

In an alternative embodiment, a single variable permeability implant mask is used to form the first dopant region and the first heavily doped region continuous with the first dopant region. A structure comprising a substrate having a variable permeability mask formed thereon is subject to a first impurity implant during which impurity ions enter the exposed portion of the substrate to form the first dopant region. The first impurity implant is performed with a low implant dosage and an implant energy which is insufficient to pass impurity ions through any portion of the implant mask.

The structure is then subjected to a second impurity implant performed with a higher implant energy than the first impurity implant. The second impurity implant passes impurity ions through a first portion of the mask and also passes impurities into the exposed portion of the substrate to form the first heavily doped region. The first heavily doped region is located along the lower boundary and side boundary of the first dopant region and is continuous with the first dopant region.

The present invention will be more fully understood in view of the following detailed description taken together with the drawings.

DETAILED DESCRIPTION OF THE PREFERRED EMBODIMENTS

Several elements shown in the following figures are substantially similar. Therefore, similar reference numbers are used to represent similar elements.

Figure 6:
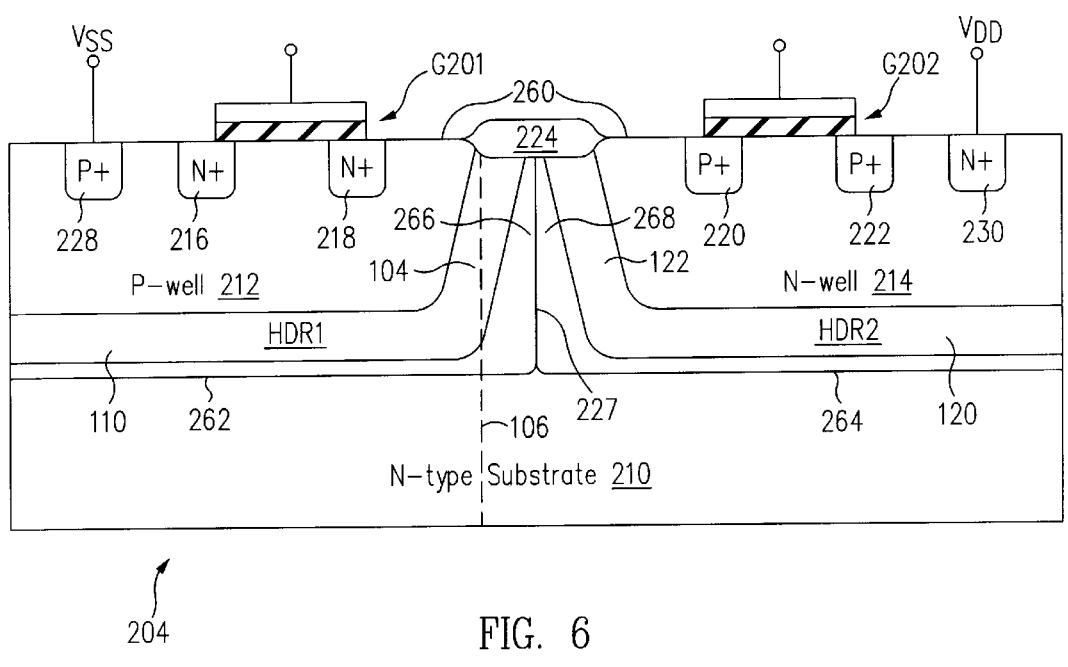
FIG. 6 is a cross-sectional view of a semiconductor device which improves latch-up immunity and interwell isolation in accordance with the present invention.

FIG. 6 is a cross-sectional view of a semiconductor device 204, for example a complementary metal oxide silicon (CMOS) device, which improves latch-up immunity and interwell isolation in accordance with the present invention. Semiconductor device 204 includes an n-type semiconductor substrate 210 having a p-well 212 and an n-well 214. Semiconductor substrate 210 is typically monocrystalline silicon. P-well 212 and n-well 214 extend from an upper surface 260 of substrate 210 and have lower boundaries 262, 264, respectively, located at a distance, typically 1.0 micrometer ($\mu$m), below upper surface 260 of substrate 210. P-well 212 has a side boundary 266 which extends from upper surface 260 of substrate 210 to lower boundary 262 of P-well 212. N-well 214 has a side boundary 268 which extends from upper surface 260 of substrate 210 to lower boundary 264 of N-well 214. Side boundaries 266, 268 of p-well 212 and n-well 214, respectively, are adjacent to each other at a boundary region 227 where the dopant concentration changes from p-type in p-well 212 to n-type in n-well 214.

Formed within P-well 212 are n⁺ source/drain regions 216, 218 and p⁺ contact region 228 which is connected to a first voltage source $V_{ss}$ (typically ground). Formed within n-well 214 are p⁺ source/drain regions 220, 222 and n⁺ contact region 230 which is connected to a second voltage source $V_{DD}$ (typically 3.3 volts (V) or 5.0 V). An insulating structure 224, typically silicon oxide, is formed at the upper surface 260 of substrate 210 overlying boundary region 227. Formed on upper surface 260 of substrate 210 are gate structures G201 and G202, each comprising, for example a gate electrode and an underlying gate oxide layer.

Located within p-well 212 is a p-type heavily doped region HDR1 having a first portion 104 and a second portion 110, wherein the dopant concentration of heavily doped region HDR1 is substantially uniform and greater than the dopant concentration of p-well 212. For example, p-well 212 typically has a dopant concentration greater than or equal to $1 \times 10^{16}$ atoms/cm³ and heavily doped region HDR1 generally has a dopant concentration greater than or equal to $1.0 \times 10^{17}$ atoms/cm³. More typically, heavily doped region HDR1 has a dopant concentration greater than or equal to $1.0 \times 10^{18}$ atoms/cm³. First portion 104 extends downward along side boundary 266 of p-well 212 from insulating structure 224 (at a distance of approximately 0.1 μm below surface 260 of n-type substrate 210) to second portion 110 (at a depth of approximately 0.9 μm below surface 260 of n-type substrate 210).

Portion 110 extends in p-well 212 from side boundary 266 of p-well 212 along lower boundary 262 of p-well 212 (portion 110 is substantially parallel to surface 260 of n-type substrate 210).

Figure 7:
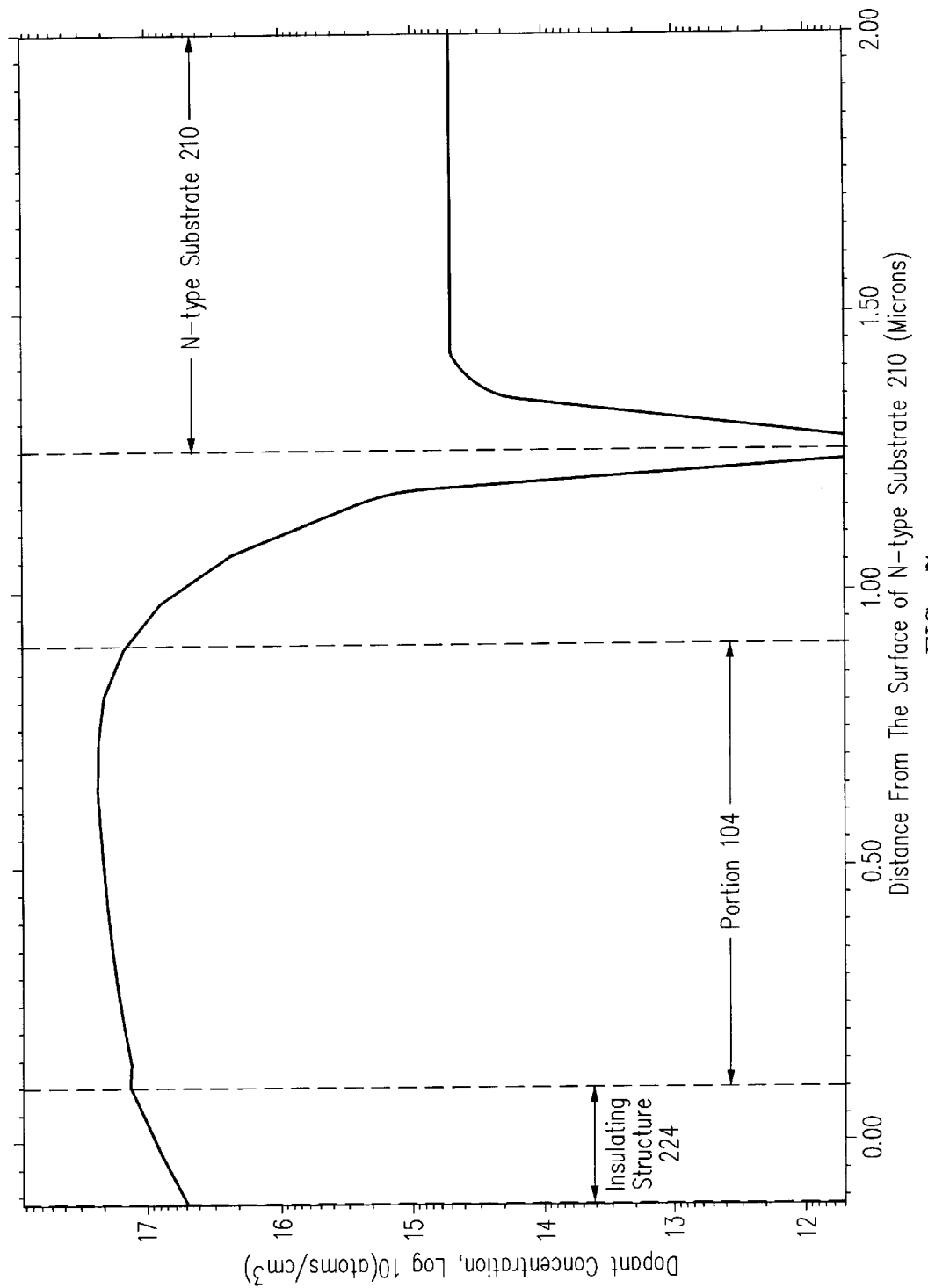
FIG. 7 is a graph which illustrates the dopant concentration along a line which extends through the p-well of FIG. 6.

FIG. 7 is a graph which illustrates dopant concentration along line 106 in FIG. 6. The dopant concentration within portion 104 is substantially uniform with a range of approximately $1.5 \times^{10^{17}}$ atoms/cm³ to $2.5 \times 10^{17}$ atoms/cm³. Of importance, since portion 104 extends from insulating structure 224, a relatively high dopant concentration (approximately $1.5 \times 10^{17}$ atoms/cm³) is obtained directly under insulating structure 224 (at a distance of approximately 0.1 μm below surface 260 of n-type substrate 210). The dopant concentration begins to decrease at a depth of approximately 0.90 μm (the lower boundary of portion 104) and continues to decrease to a depth of approximately 1.25 μm. At depths greater than approximately 1.25 μm, the uniform dopant concentration of substrate 210 is seen.

Forming p-type heavily doped region HDR1 in accordance with the present invention improves both vertical and horizontal latch-up immunity. Heavily doped region HDR1 has higher conductivity (lower resistance) than p-well 212. In particular, portion 104 forms a region of low resistance directly under insulating structure 224 which extends along side boundary 266 of p-well 212 and portion 110 forms a region of low resistance at lower boundary 262 of p-well 212. The low resistance of heavily doped region HDR1 reduces the gain of vertical and lateral NPN parasitic bipolar transistors formed by the n⁺ source/drain regions 216, 218, p-well 212 and n-well 214, n-type substrate 210 and hence improves both vertical and lateral latch-up immunity.

Forming p-type heavily doped region HDR1 in accordance with the present invention also improves interwell isolation. Heavily doped region HDR1 restricts current flow across boundary region 227. Thus, interwell isolation is improved. Further, since the dopant concentration near the surface of p-well 212 in the region where n-type source/drain regions 216, 218 (see FIG. 6) are located is substantially unaffected by the p-type impurity implant, latch-up immunity and interwell isolation are improved and threshold voltage tolerances are maintained.

As shown in FIG. 6, located within n-well 214 is an n-type heavily doped region HDR2 having a first portion 122 and a second portion 120, wherein the dopant concentration of heavily doped region HDR2 is substantially uniform and greater than the dopant concentration of n-well 214. For example, n-well 214 typically has a dopant concentration greater than or equal to $1 \times 10^{16}$ atoms/cm³ and heavily doped region HDR2 generally has a dopant concentration greater than or equal to $1.0 \times 10^{17}$ atoms/cm³. More typically, heavily doped region HDR2 has a dopant concentration greater than or equal to $1.0 \times 10^{18}$ atoms/cm³. First portion 122 extends downward along side boundary 268 of n-well 214 from insulating structure 224 (at a distance of approximately 0.1 μm below surface 260 of n-type substrate 210) to second portion 120 (at a depth of approximately 0.9 μm below surface 260 of n-type substrate 210).

Second portion 120 extends within n-well 214 from side boundary 268 of n-well 214 along lower boundary 264 of n-well 214 (portion 120 is substantially parallel to surface 260 of n-type substrate 210).

N-type heavily doped region HDR2 has higher conductivity (lower resistance) than n-well 214. The low resistance reduces the gain of PNP parasitic bipolar transistors formed by the p⁺ source/drain regions 220, 222, n-well 214, and p-well 212, which improves latch-up immunity. Heavily doped region HDR2 (primarily portion 122) also improves interwell isolation. Further, since the dopant concentration near the surface of n-well 214 in the region where p-type source/drain region 220, 222 are located is substantially unaffected by the n-type impurity implant, latch-up immunity and interwell isolation are improved and threshold voltage tolerances are maintained.

Semiconductor device 204 is shown and described as having a p-type heavily doped region HDR1 in p-well 212 and an n-type heavily doped region HDR2 in n-well 214. However, in alternative embodiments, latch-up immunity and interwell isolation are improved by forming a heavily doped region in only one of the wells, i.e. by forming a p-type heavily doped region HDR1 in p-well 212 or alternatively, by forming an n-type heavily doped region HDR2 in n-well 214.

Although semiconductor device 204 is set forth in accordance with one embodiment of the present invention, it is understood that persons skilled in the art will recognize that changes may be made in form and detail without departing from the spirit and scope of the invention. For example, a semiconductor device could be formed such as in FIG. 6 without gate structures G201, G202 or source/drain regions 216, 222.

Figure 8:
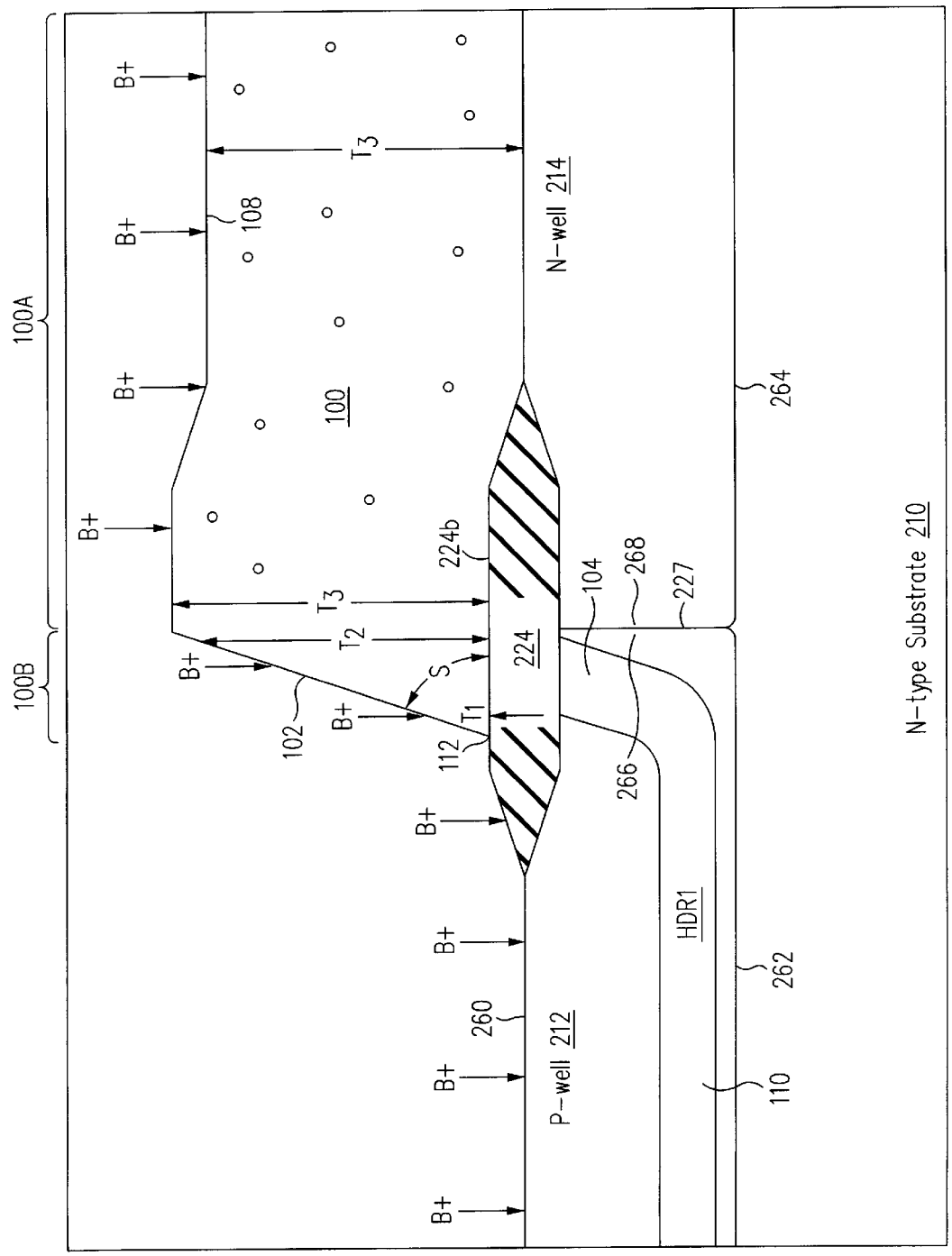
FIG. 8 is a cross-sectional view of a semiconductor device having a p-type heavily doped region formed within the p-well in accordance with the present invention.

FIG. 8 illustrates the formation of p-type heavily doped region HDR1 having first portion 104 and second portion 110 in p-well 212. Referring to FIG. 8, an implant mask 100, made of positive or negative photoresist is formed overlying n-well 214 and overlying a portion of insulating structure 224. Implant mask 100 has a sloped surface 102 which overlies p-well 212 near boundary region 227.

The structure is subjected to a high energy implant of a p-type impurity, shown as B⁺ for boron, although other p-type impurities such as boron diflouride ions (BF$_2$⁺) can be used. The high energy implantation forms a heavily doped region HDR1 having a substantially uniform dopant concentration and a first portion 104 and a second portion 110. The impurity ions enter the exposed portion of p-well 212 to form second portion 110 along lower boundary 262 of p-well 212. The high energy implantation does not significantly affect the dopant concentration near the surface of p-well 212 in the region where the n-type source/drain regions (216, 218 in FIG. 6) are typically subsequently formed.

Implant mask 100 has a variable thickness. The amount of implant energy lost by impurity ions while passing through implant mask 100 is related to the thickness of the portion of implant mask 100 passed through. The greater the thickness, the greater the implant energy loss. In other words, the permeability of implant mask 100 to implanted impurities varies with the thickness of implant mask 100 where the permeability is a measure of the amount of implant energy which impurity ions retain while passing through implant mask 100.

To illustrate, referring to FIG. 8, the portion 1OOA of implant mask 100 which overlies n-well 214 is relatively thick with a thickness shown as $T_3$. Thickness $T_3$ is sufficient to prevent impurity ions from passing through implant mask 100 into n-well 214, i.e., portion 100A has a very low permeability to implanted impurities. Generally, thickness $T_3$ is greater than or equal to 2.0 $\mu$m and is preferably in the range of 2.0 $\mu$m to 2.5 $\mu$m.

The portion 100B of implant mask 100 formed with sloped surface 102 which overlies p-well 212 is relatively thinner than portion 100A and therefore has a higher permeability to implanted impurities than portion 100A. Thus, impurity ions pass through portion 100B, through the underlying portion of insulating structure 224 and enter into p-well 212 to form first portion 104.

Since portion 100B is formed with sloped surface 102, portion 100B has a variable thickness and therefore a variable permeability to implanted impurities. To illustrate, near an edge 112 of sloped surface 102 (i.e., where sloped surface 102 intersects with the top surface 224b of insulated structure 224), portion 100B is relatively thin with a thickness shown as $T_1$. Since portion 100B is relatively thin in this region, portion 100B has a relatively high permeability to impurity ions in this region. Thus, near edge 112, impurity ions which enter sloped surface 102 and pass through implant mask 100 retain a substantial amount of implant energy and are implanted relatively deep into p-well 212.

Conversely, regions of portion 100B which are further from edge 112 are thicker with a thickness shown as $T_2$. The thicker regions of portion 100B have lower permeability to implanted impurities and impurity ions passing through implant mask 100 in these thicker regions have a shallow implant depth in underlying P-well 212. As a result, portion 104 has a profile similar to the profile of sloped surface 102 and extends downward from insulating structure 224 along side boundary 266 to portion 110 with a slope towards the main body of P-well 212, as shown in FIG. 8.

Although the implant depth is related to the thickness of portion 100B, the concentration of impurity ions which pass through any particular region of portion 100B is substantially independent of the thickness. As a result, portion 104 has a substantially uniform dopant concentration.

Figure 1:
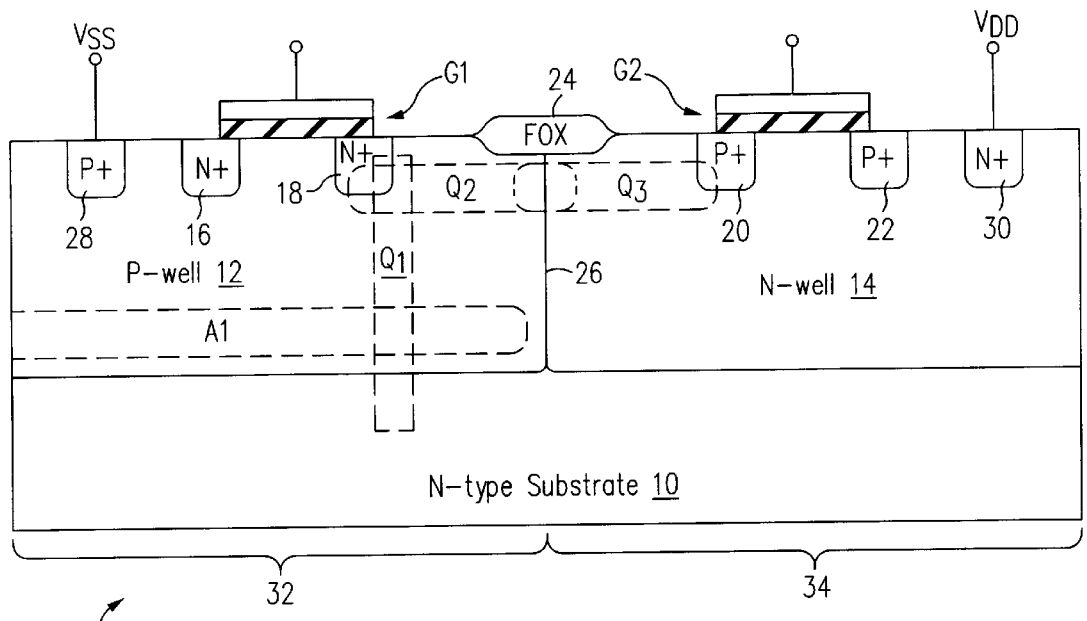
FIG. 1 is a cross-sectional view of a prior art semiconductor device which is susceptible to latch-up.
Figure 2:
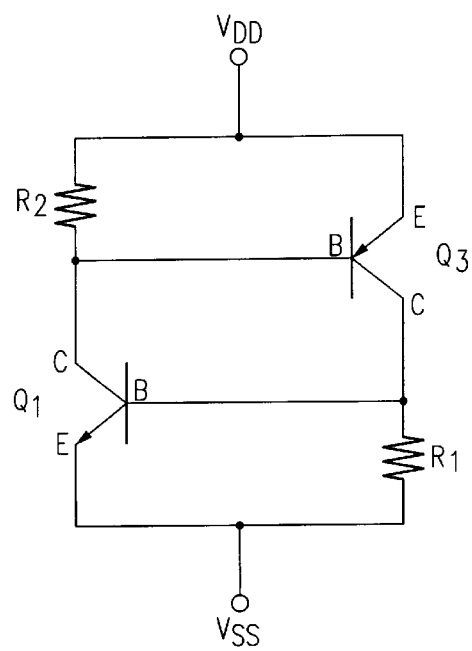
FIG. 2 is a diagram of the latch-up circuit of the semiconductor device shown in FIG. 1.
Figure 3:
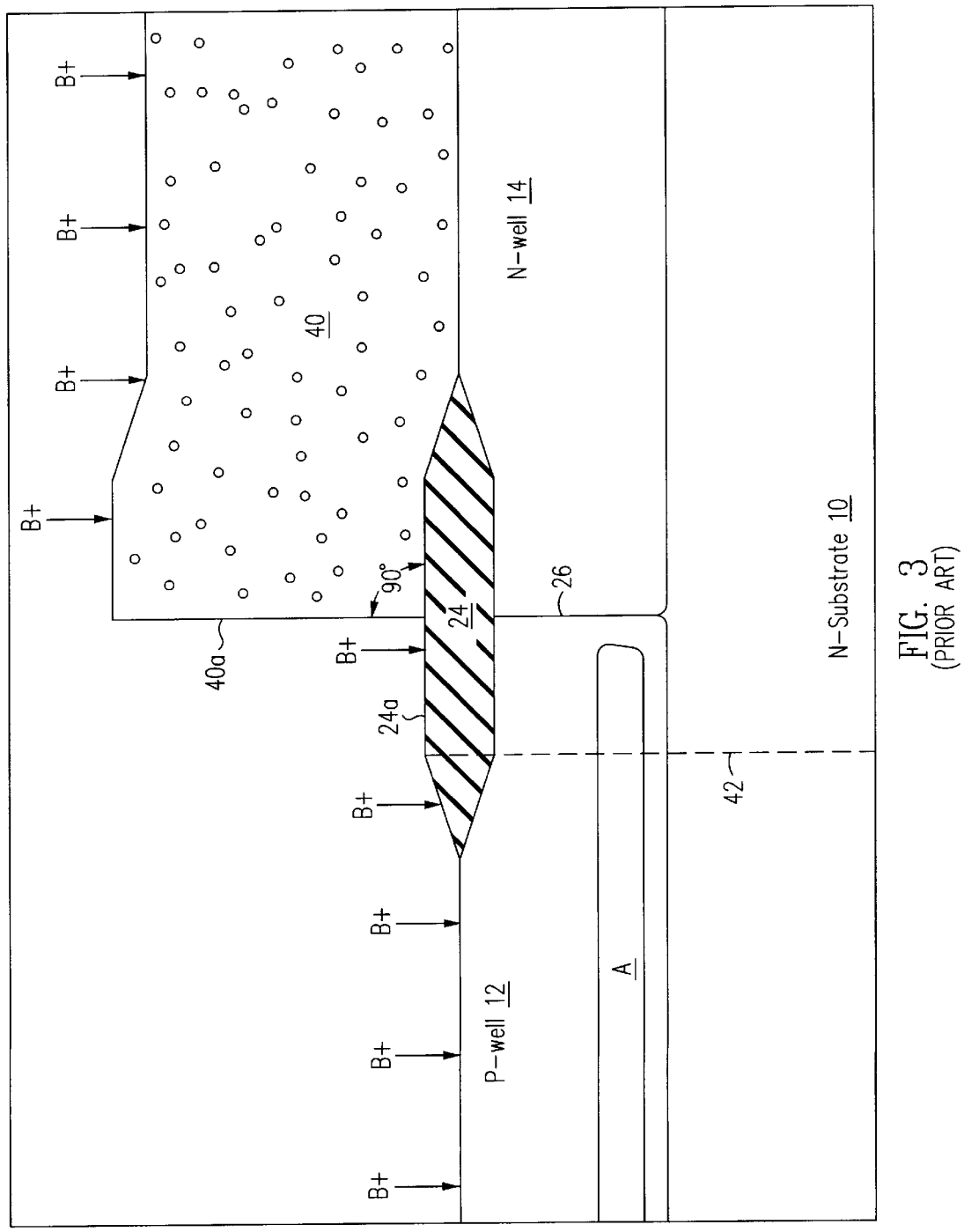
FIG. 3 is a cross-sectional view of a prior art semiconductor device having a p-type heavily doped region formed at the lower boundary of the p-well.
Figure 4:
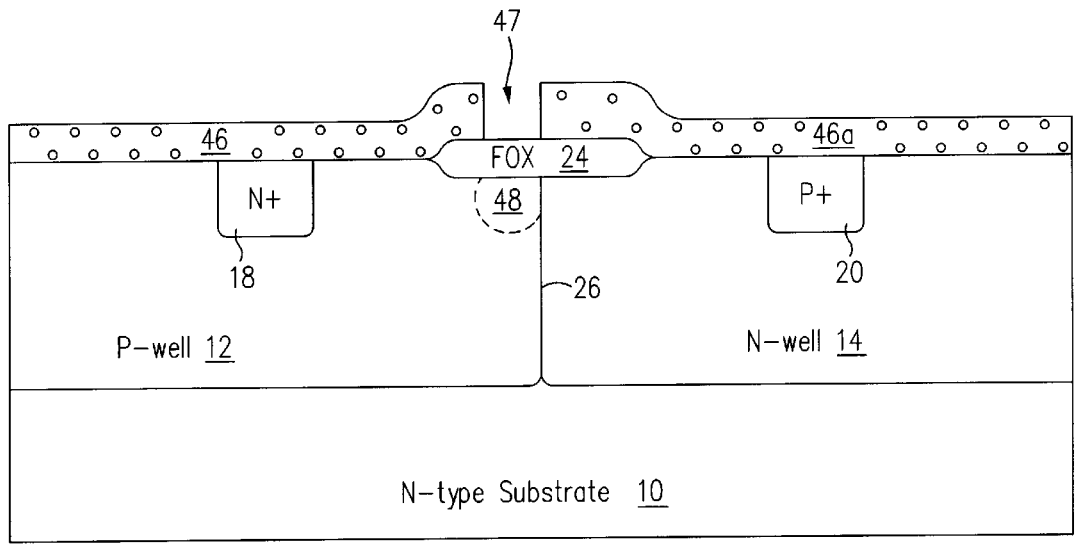
FIG. 4 is a cross-sectional view of a prior art semiconductor device having a p-type plug within the p-well.
Figure 5:
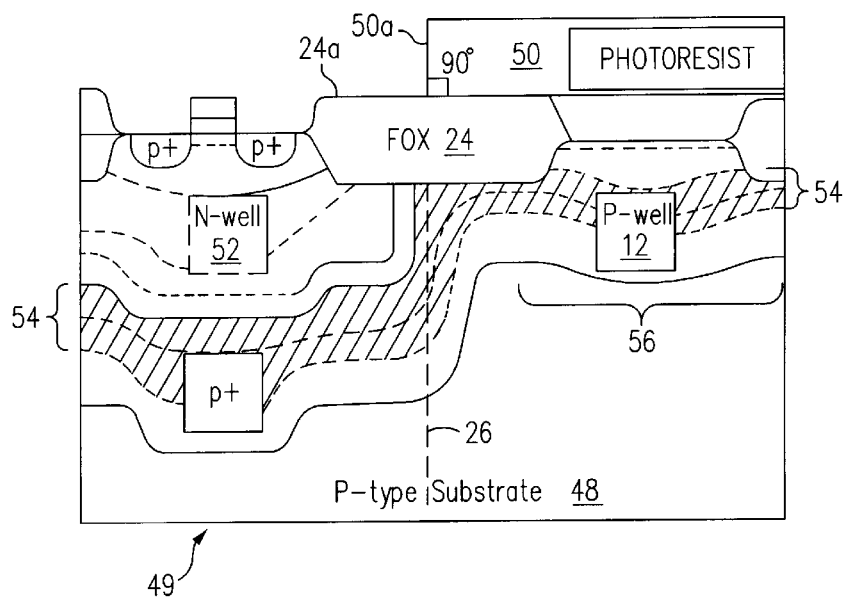
FIG. 5 is a cross-sectional view of a prior art semiconductor device having a buried implanted layer for lateral isolation.

To form implant mask 100 having a sloped surface 102, in one embodiment photoresist is deposited and patterned using conventional methods to form a photoresist mask which has a substantially perpendicular side (such as mask 40 in FIG. 3 in which side 40a is substantially perpendicular to the top surface 24a of field oxide structure 24). In accordance with the invention, the photoresist mask is then heated to a temperature which causes the photoresist mask to liquify and flow. For example, if TOK THMR IP3500CP resist manufactured by Ohka America, Inc. is used to form the photoresist mask, then heating the photoresist mask to a temperature between 100° C. to 130° C. for 60 seconds is sufficient to form a sloped surface 102.

By controlling the amount of time which the photoresist mask is held at a certain temperature, the degree of flow (deformation) and hence slope of surface 102 is controlled. To illustrate, if the heating time is increased, the amount of deformation increases and the slope of surface 102 and angle S decreases (angle S is the angle formed by sloped surface 102 and the upper surface 224b of insulating structure 224). Conversely, by decreasing the heating time, the amount of deformation decreases and the slope of surface 102 and angle S increases.

Alternatively, by controlling the temperature to which the photoresist mask is heated (for a fixed period of time), the degree of flow and hence slope of surface 102 is controlled. Raising the temperature increases the deformation and hence decreases the slope of surface 102 and angle S. Conversely, lowering the temperature decreases the deformation and hence increases the slope of surface 102 and angle S.

The slope of surface 102 determines the slope of portion 104. Increasing (decreasing) the slope of surface 102 increases (decreases) the slope of portion 104. Angle S should be less than 90° and preferably is in the range of 45° to 70°.

In another embodiment, implant mask 100 is formed by defocusing the light used to pattern the resist. Defocusing is accomplished by moving one of the focusing lenses during exposure of the photoresist layer. The defocused light effects the edges of the photoresist making the photoresist edges thinner than usual. (To form a conventional patterned mask, such as mask 40 in FIG. 3, photoresist is spread uniformly across the wafer and a light pattern is focused using a series of lenses onto the photoresist. If a positive photoresist is used, then the light exposed photoresist regions are stripped (if a negative photoresist is used, then the unexposed photoresist regions are stripped) and the patterned mask is formed.)

Figure 9A:
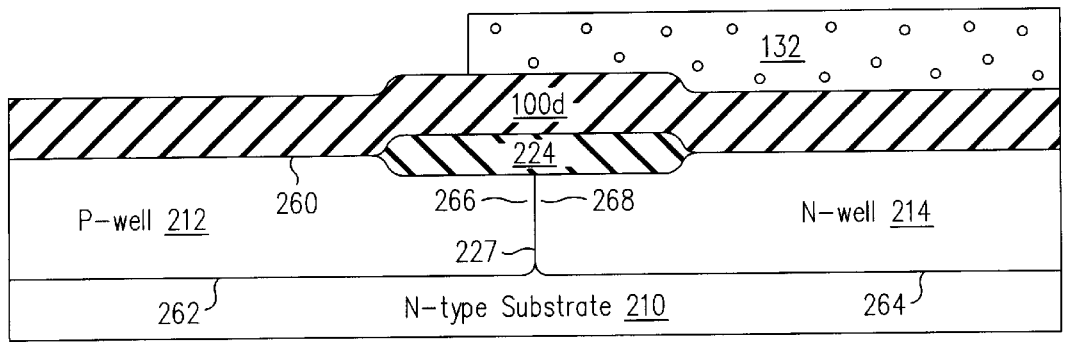
FIGS. 9a to 9c are cross-sectional views of a semiconductor device which illustrate the formation of an oxide implant mask having a sloped surface in accordance with one embodiment of the present invention.
Figure 9B:
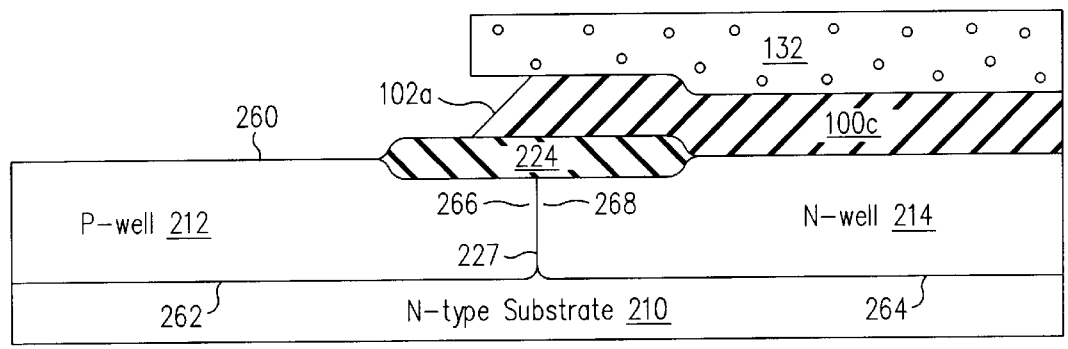
Figure 9C:
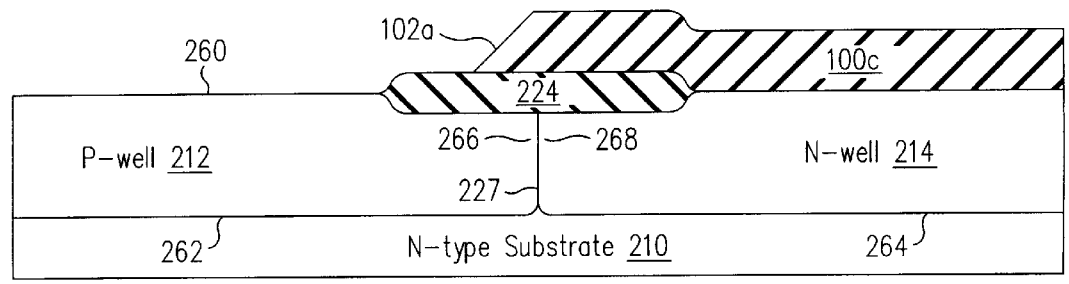

In accordance with an alternative embodiment of the present invention, FIGS. 9a to 9c illustrate another method of forming an implant mask 100c having a sloped side 102a. In FIGS. 9a to 9c, implant mask 100c is not photoresist but is oxide, although other materials such as nitride, phosphosilicate glass (PSG), polysilicon or a combination thereof, can be used. As shown in FIG. 9a, an oxide layer 100d is deposited on surface 260 of n-type substrate 210 using methods well known to those skilled in the art. Photoresist is then deposited on oxide layer 100d and patterned to form photoresist mask 132. Photoresist mask 132 overlies n-well 214 and overlies a portion of p-well 212 near boundary region 227.

Using photoresist mask 132, oxide layer 100d is then etched isotropically, i.e. is etched nonpreferentially in all directions, until the only remaining oxide is a portion 100c (FIG. 9b) which underlies photoresist mask 132. Oxide layer 100d (FIG. 9a) has a high selectivity to the isotropic etch as compared to insulating structure 224. For example, oxide layer 100d is a chemical vapor deposition (CVD) deposited doped oxide, such as phosphorus doped oxide and insulating structure 224 is a thermally grown oxide. Thus, insulating structure 224 is not significantly etched during the etch of oxide layer 100d. Since oxide layer 100d is etched isotropically, portion 100c has a sloped side 102a. Photoresist mask 132 is then stripped leaving behind oxide portion 100c having sloped side 102a, as shown in FIG. 9c.

Figure 10:
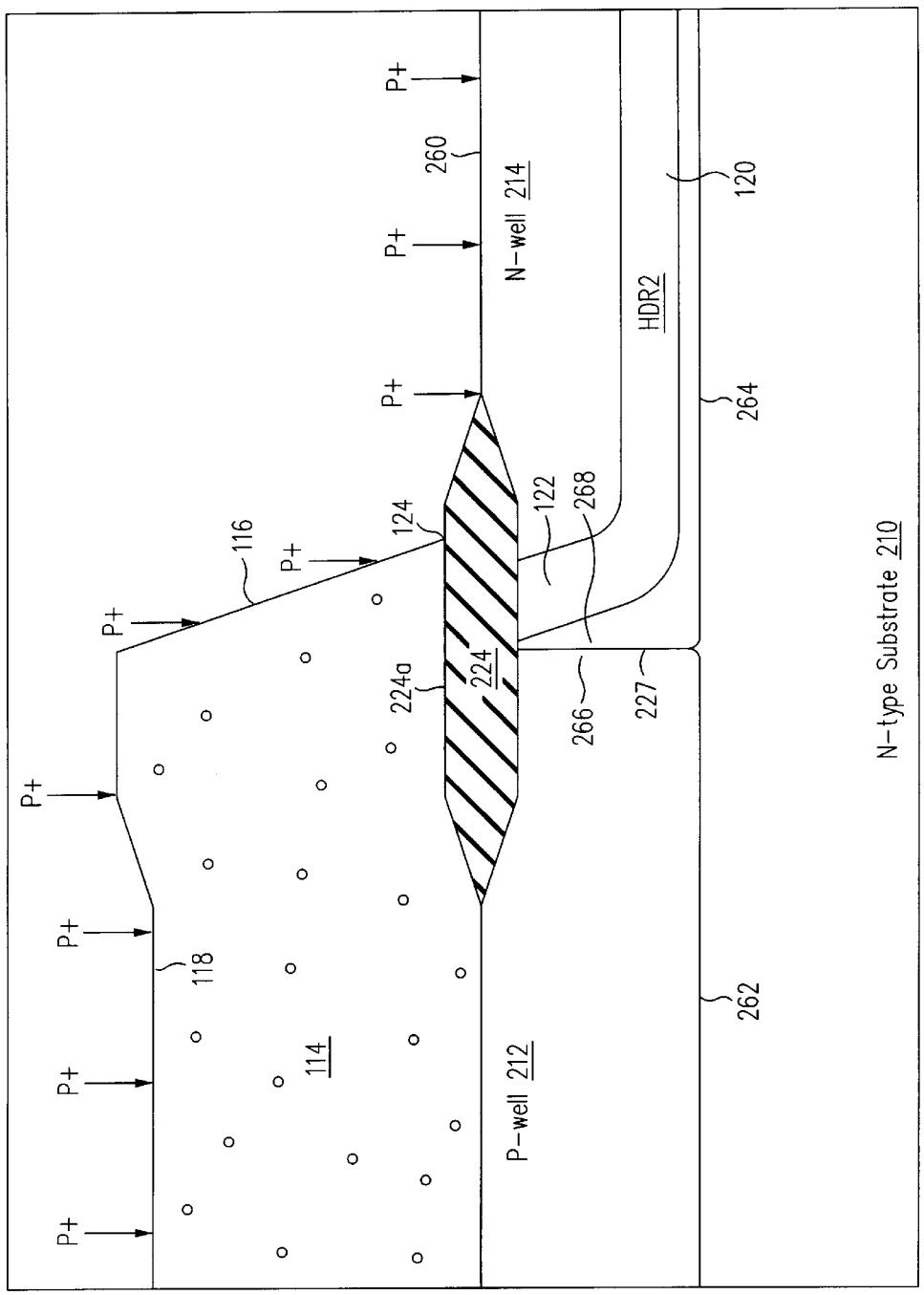
FIG. 10 is a cross-sectional view of a semiconductor device in accordance with an alternative embodiment of the present invention.

FIG. 10 illustrates the formation of n-type heavily doped region HDR2 having first portion 122 and second portion 120 in n-well 214 in accordance with one embodiment of the present invention. Referring to FIG. 10, an implant mask 114 is formed overlying p-well 212 and overlying a portion of insulating structure 224. Implant mask 114 has a sloped surface 116 which overlies n-well 214 near boundary region 227. (Sloped surface 116 is formed using the same techniques as those used to form sloped surface 102 in FIG. 8.)

The structure is then subjected to a high energy implant of an n-type impurity shown as p$^+$ for phosphorous although other n-type impurities such as arsenic can be used. The high energy implantation forms a heavily doped region HDR2 having a substantially uniform dopant concentration and a first portion 122 and a second portion 120. The impurity ions enter implant mask 114 through surface 116, pass through implant mask 114, pass through the underlying insulating structure 224 and are implanted into n-well 214 near boundary region 227 to form first portion 122. The impurity ions also implant into the exposed region of n-well 214 to form second portion 120 without significantly affecting the dopant concentration near the surface of n-well 214 in the region where the p-type source/drain regions (220, 222 in FIG. 6) are typically subsequently formed. However, implanted ions which enter top surface 118 of mask 114 do not pass through implant mask 114 and do not implant into p-well 212.

Implant mask 114 has a variable thickness, hence variable permeability to impurity ions because of sloped surface 116 (for the same reasons as those discussed in reference to implant mask 100 and sloped surface 102 in FIG. 8). Thus, impurity ions implanted through sloped surface 116 into n-well 214 have a greater implant depth under regions of sloped surface 116 near the edge 124 (i.e. where sloped surface 116 intersects top 224a of insulating structure 224) than under the regions of sloped surface 116 further away from edge 124. For this reason, first portion 122 extends downward from insulating structure 224 with a slope towards the main body of n-well 214.

Sloped surfaces 102, 102a and 116 in FIGS. 8, 9c and 10, respectively, are shown as straight lines for flat surfaces. In alternative embodiments, 102, 102a and 116 are not flat surfaces, but rather, are concave or convex surfaces.

In accordance with the invention, p-type heavily doped region HDR1 and n-type heavily doped region HDR2 are formed in p-well 212 and n-well 214, respectively, by sequentially performing the implants shown in FIGS. 8 and 10. In one embodiment, implant mask 100 (FIG. 8) is formed and the structure is subjected to a p-type impurity implant to form p-type heavily doped region HDR1 in p-well 212. Implant mask 100 is then stripped and a second implant mask 114 (FIG. 10) is formed. The structure is then subjected to an n-type impurity implant to form n-type heavily doped region HDR2 in n-well 214. Implant mask 114 is then stripped resulting in a structure similar to the structure shown in FIG. 6 wherein p-well 212 has contained within p-type heavily doped region HDR1 and wherein n-well 214 has contained within n-type heavily doped region HDR2. Although in the embodiment described above, a structure similar to the FIG. 6 structure is formed by first performing a p-type implant (FIG. 8) and subsequently an n-type implant (FIG. 10) in alternative embodiments a structure similar to the FIG. 6 structure is formed by first performing an n-type implant (FIG. 10) and subsequently a p-type implant (FIG. 8).

Figure 11A:
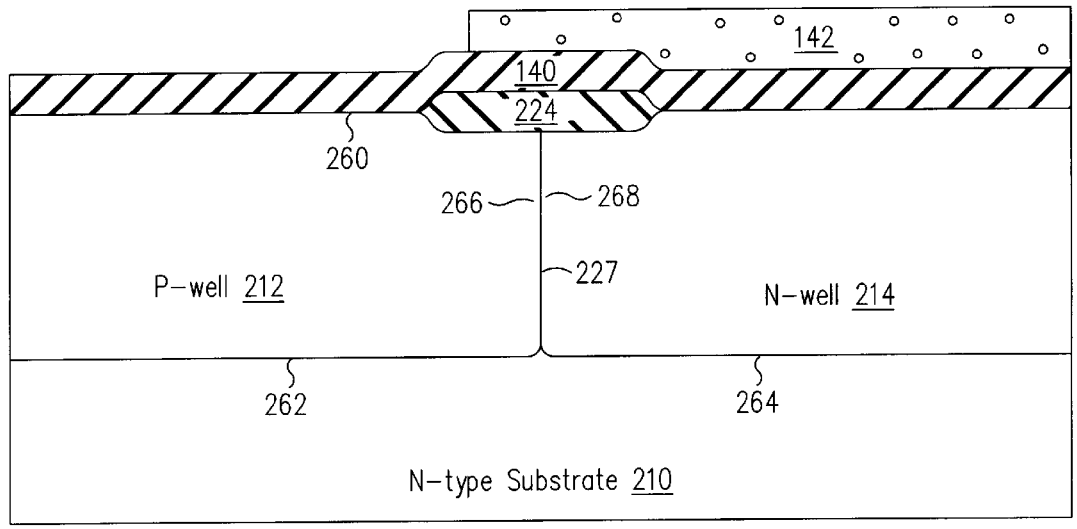
FIGS. 11a and 11b are cross-sectional views of a semiconductor device which illustrate the formation of a p-type heavily doped region in a p-well in accordance with an alternative embodiment of the present invention.
Figure 11B:
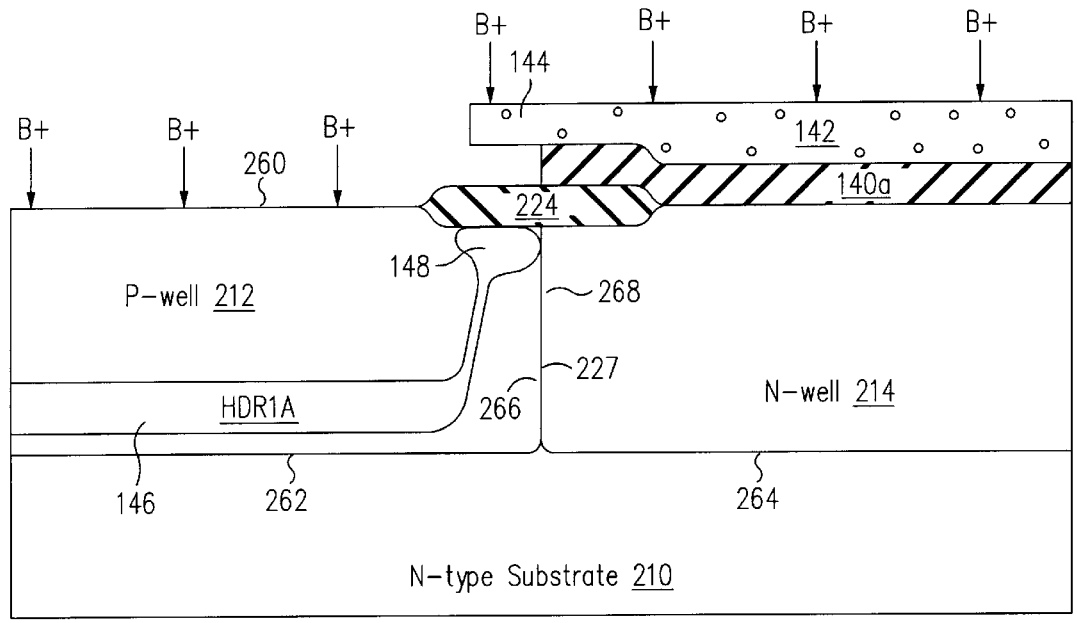

FIGS. 11a and 11b illustrate the formation of a p-type heavily doped region HDR1A in p-well 212 in accordance with an alternative embodiment of the present invention. As shown in Fig. 11a, an oxide layer 140 is deposited on surface 260 of n-type substrate 210 although other materials such as nitride, PSG, polysilicon, or a combination thereof, can be deposited. Photoresist is then deposited on oxide layer 140 and patterned to form photoresist mask 142. Photoresist mask 142 overlies n-well 214 and overlies a portion of p-well 212 near boundary region 227. The exposed oxide layer is then removed by performing an anisotropic etch followed by an isotropic over etch which forms a patterned oxide layer 140a as shown in FIG. 11b. By overetching the oxide layer 140, a portion 144 of photoresist mask 142 is left overhanging p-well 212 near boundary region 227. Portion 144 typically extends over p-well 212 by 0.1 $\mu$m to 0.3 $\mu$m.

The structure is then subjected to a high energy p-type impurity implant shown as B$^+$. The high energy implantation forms a p-type heavily doped region HDR1A having a substantially uniform dopant concentration and a first portion 148 and a second portion 146. In particular, the impurity ions implant into the exposed region of p-well 212 to form portion 146 along lower boundary 262 of P-well 212.

Photoresist mask 142 and oxide layer 140a together form an implant mask which has variable permeability to implanted ions. In particular, the impurity ions do not pass through photoresist mask 142 and oxide layer 140a and do not implant into n-well 214. However, the impurity ions do pass through portion 144, through insulating structure 224, and implant into p-well 212 near boundary region 227 to form portion 148 along side boundary 266 of p-well 212.

Since a substantial amount of implant energy is required to pass impurities through portion 144 and insulating structure 224, the bulk of portion 148 is formed relatively shallow (near top surface 260) in p-well 212. Although portions 146, 148 are shown as continuous in FIG. 11b, in an alternative embodiment, portion 146 is not continuous with portion 148.

Figure 12A:
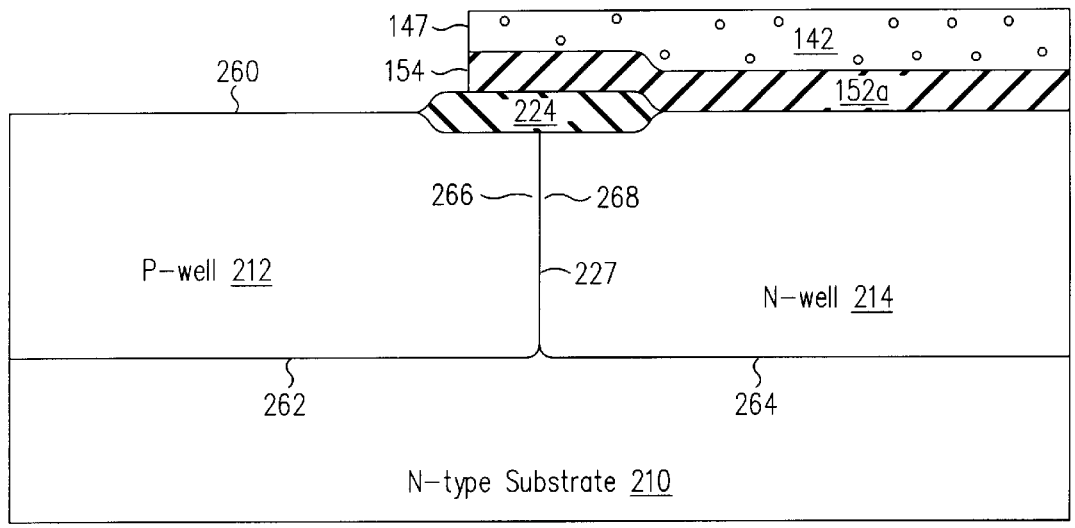
FIGS. 12a and 12b are cross-sectional views of a semiconductor device which illustrate the formation of a p-type heavily doped region in a p-well in accordance with an alternative embodiment of the present invention.
Figure 12B:
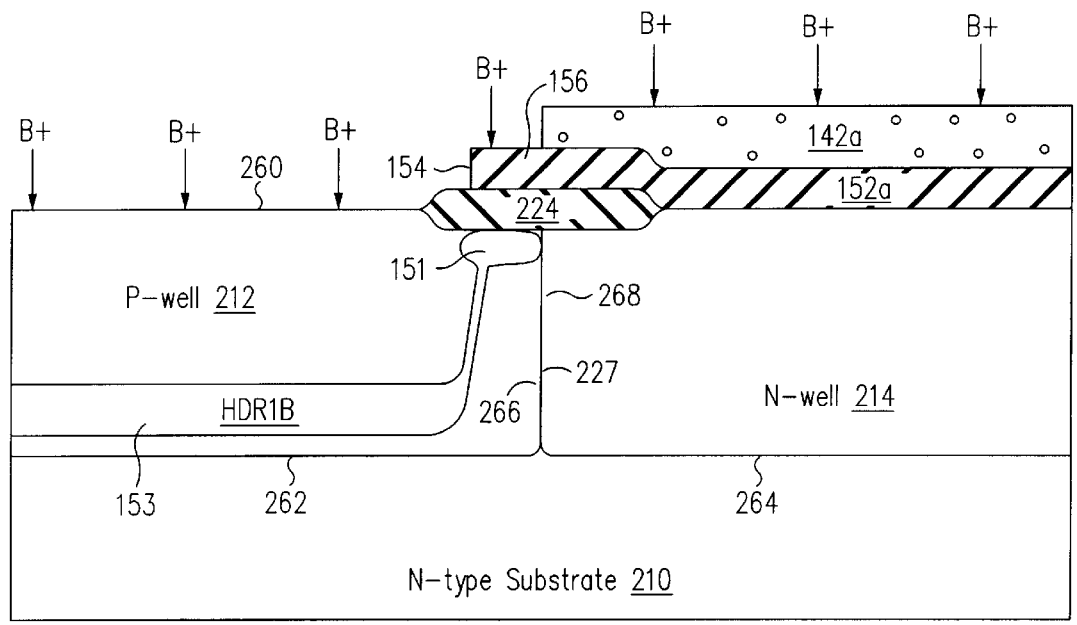

FIGS. 12a and 12b illustrate the formation of p-type heavily doped region HDR1B in p-well 212 in accordance with an alternative embodiment of the present invention. Initially, the FIG. 11a structure is formed. The exposed oxide layer is then etched anisotropically and removed to form a patterned oxide layer 152a, as shown in FIG. 12a. By using an anisotropic etch, side 154 of oxide layer 152a is aligned directly below side 147 of photoresist mask 142. The edge portion of photoresist mask 142 is then removed (for example through oxidation) thus exposing a portion 156 of oxide layer 152a which overlies p-well 212, as shown in FIG. 12b. Portion 156 typically extends over p-well 212 by 0.1 $\mu$m to 0.3 $\mu$m.

The structure is then subjected to a high energy p-type impurity implant shown as B$^+$. The high energy implantation forms p-type heavily doped region HDR1B having a substantially uniform dopant concentration and a first portion 151 and a second portion 153. In particular, the impurity ions enter into the exposed region of p-well 212 to form portion 153 along lower boundary 262.

Photoresist mask 142a and oxide layer 152a together form an implant mask which has variable permeability to implanted ions. In particular, the impurity ions do not pass through both photoresist mask 142a and oxide layer 152a and do not implant into n-well 214. However, the impurity ions do pass through portion 156, through insulating structure 224, and implant into p-well 212 near boundary region 227 to form portion 151 along side boundary 266 of p-well 212.

Since a substantial amount of implant energy is required to pass impurities through portion 156 and insulating structure 224, the bulk of portion 151 is formed relatively shallow (near top surface 260) in p-well 212.

For reasons similar to those discussed in regards to p-type heavily doped region HDR1 in FIG. 6, p-type heavily doped region HDR1A improve both vertical and lateral latch-up immunity and interwell isolation without significantly affecting threshold voltage tolerance.

The text related to FIGS. 11a, 11b and 12a, 12b describes the formation of a semiconductor device in which p-type heavily doped regions HDR1A, HDR1B, respectively, are formed in p-well 212. As those skilled in the art will understand, the illustrations and related discussion also apply to the formation of a semiconductor device in which an n-type heavily doped region is formed in the n-well along the side and lower boundaries of the n-well. Further, it is understood that the illustrations and related discussion also apply to the formation of a semiconductor device in which a p-type heavily doped region is formed in the p-well and an n-type heavily doped region is formed in the n-well along the sides and lower boundaries of the respective well regions. Also, the thicknesses of portions 142, 140a (FIG. 11b) and 142a, 152a (FIG. 12b) depend upon the desired device characteristics and, in particular, depend upon the implant energy and dosage used to form HDR1A, HDR1B, respectively.

Figure 13A:
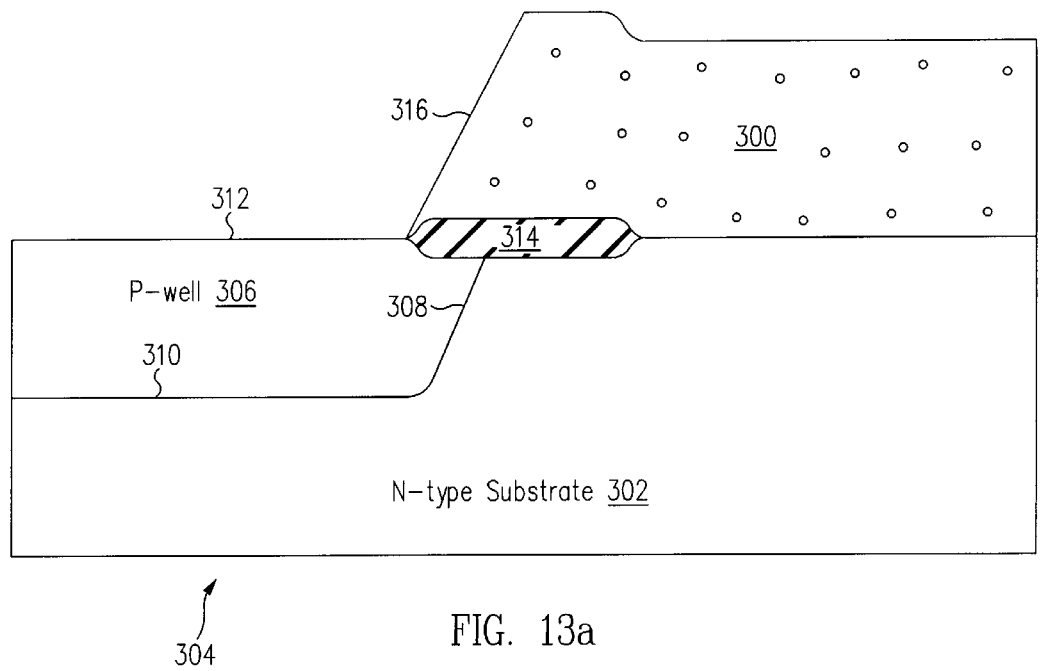
FIGS. 13a and 13b are cross-sectional views of a semiconductor device which illustrate the formation of a p-type well and a p-type heavily doped region in the p-well using a single mask with a sloped surface in accordance with alternative embodiment of the present invention.
Figure 13B:
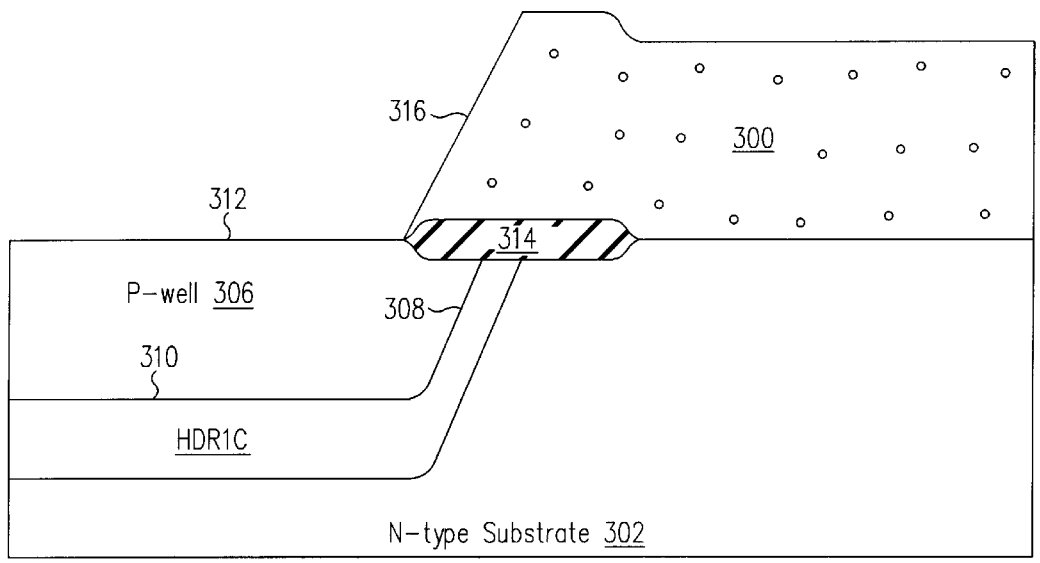

FIGS. 13a and 13b illustrate the formation of a p-well and a p-type heavily doped region in an n-type substrate 302 using a single mask 300 in accordance with an alternative embodiment of the present invention. As shown in FIG. 13a, mask 300 is formed over the top surface 312 of an n-type substrate 302. Although mask 300 is shown as covering insulating structure 314, in alternative embodiments insulating structure 314 is only partially covered. Mask 300 has a sloped surface 316 similar to sloped surface 102 of mask 100 in FIG. 8.

The structure 304 is subjected to one or more p-type impurity implants during which impurity ions enter the exposed portion of substrate 302 (the portion not covered by mask 300) to form p-well 306 having a lower boundary 310 and a side boundary 308 extending from top surface 312 of substrate 302 to lower boundary 310. The one or more p-type impurity implants are performed with a low implant dosage and an implant energy which is sufficient to pass impurity ions which enter sloped surface 316 through mask 300, through insulating structure 314 and into the underlying n-type substrate 302. However, the implant energy is insufficient to pass impurity ions through any other portion of mask 300. Alternatively, the one or more p-type impurity implants are performed with a low implant dosage and an implant energy which is insufficient to pass impurity ions through any portion of mask 300.

Structure 304 is then subjected to an additional p-type impurity implant performed with a higher implant energy than the first impurity implant(s) which formed p-well 306. The additional p-type impurity implant forms p-type heavily doped region HDR1C as shown in FIG. 13b for the same reasons as those discussed in reference to the formation of p-type heavily doped region HDR1 in FIG. 8. As shown in FIG. 13b, HDR1C is formed along the side boundary 308 and lower boundary 310 of p-well 306 and is continuous with p-well 306.

Although FIGS. 13a and 13b illustrate the formation of a p-well 306 and a p-type heavily doped region HDR1C along the side boundary 308 and lower boundary 310 of p-well 306, in alternative embodiments a single mask with a sloped surface is used to form an n-well and an n-type heavily doped region along the side boundary and lower boundary of the n-well. In other embodiments, a first mask with a sloped surface is used to form a p-well and a p-type heavily doped region along the side and lower boundary of the p-well. The first mask is stripped and a second mask having a sloped surface is formed. The second mask is then used to form an n-well and an n-type heavily doped region along the side and lower boundaries of the n-well. It is understood that a two layer variable permeability mask (shown in FIGS. 11a, 11b and 12a, 12b) can also be used in a fashion similar to mask 300 in FIGS. 13a and 13b to form a doped well region and a heavily doped region continuous with the doped well region. It is also understood that various implant energies and dosages are used during the implantations which depend upon the desired device characteristics.

Although the present invention has been described with reference to preferred embodiments, persons skilled in the art will recognize that changes may be made in form and detail without departing from the spirit and scope of the invention. For example, instead of using an n-type substrate, a p-type substrate can be used. Further, in addition to CMOS devices, the invention can be used with any well region, for example the invention can be used in the formation of a metal oxide semiconductor field effect transistor (MOSFET). Also, it is understood that additional impurity implants can be performed, for example to control the threshold voltage and punch-through voltage of the semiconductor device. In addition, although in several embodiments a p-well and an n-well are illustrated, it is understood that the substrate can form one of the well regions. For example, if an n-type substrate is used the n-type substrate can form the n-well or alternatively the n-well can be separately doped to have a higher n-type dopant concentration than the n-type substrate. Thus, the invention is limited only by the following claims.

We claim:

1. A method of forming a semiconductor device from a substrate, said substrate having a first semiconductor region, said method comprising the steps of:

forming an implant mask having a first portion and a second portion over an upper surface of said substrate, said first portion overlying a first portion of said first semiconductor region; and implanting impurities into said implant mask wherein said impurities pass through said first portion of said implant mask and do not pass through said second portion of said implant mask, wherein said impurities enter into said first portion of said first semiconductor region after passing through said first portion of said implant mask thereby creating a second semiconductor region, and wherein, during said step of implanting, said impurities enter into a second portion of said first semiconductor region not covered by said implant mask thereby creating a third semiconductor region.

2. The method of claim 1 wherein said impurities do not significantly affect a dopant concentration of said second portion of said first semiconductor region near said upper surface of said substrate.

3. The method of claim 1 wherein said first semiconductor region has a lower boundary located below said upper surface and a side boundary extending from said upper surface to said lower boundary, said second semiconductor region located along said side boundary, said third semiconductor region located along said lower boundary.

4. The method of claim 1 wherein said second semiconductor region and said third semiconductor region are substantially continuous and have a substantially uniform dopant concentration which is greater than a dopant concentration of said first semiconductor region.

5. The method of claim 4 wherein said second semiconductor region and said third semiconductor region have dopant concentrations greater than or equal to approximately $1.0 \times 10^{17}$ atoms/cm$^3$.

6. The method of claim 1 wherein said second semiconductor region and said third semiconductor region are regions with low resistivities which inhibit vertical and lateral latch-up.

7. A method of forming a semiconductor device from a substrate, said substrate having a first semiconductor region, said method comprising the steps of:

forming an implant mask having a first portion and a second portion over an upper surface of said substrate, said first portion overlying a first portion of said first semiconductor region, said first portion having a sloped surface; and implanting impurities into said implant mask wherein said impurities pass through said first portion of said implant mask and wherein said impurities do not pass through said second portion of said implant mask; said method further comprising the steps of:

depositing a photoresist on said substrate;

patterning said photoresist to form a photoresist mask which has a substantially perpendicular side; and heating said photoresist mask to form said implant mask with said sloped surface.

8. The method of claim 7 wherein said step of heating further comprises the step of controlling a slope of said sloped surface by controlling the duration of said heating step.

9. The method of claim 7 wherein said step of heating further comprises the step of controlling a slope of said sloped surface by controlling the temperature to which said photoresist mask is heated during said heating step.

10. A method of forming a semiconductor device from a substrate, said substrate having a first semiconductor region, said method comprising the steps of:

forming an implant mask having a first portion and a second portion over an upper surface of said substrate, said first portion overlying a first portion of said first semiconductor region, said first portion having a sloped surface; and implanting impurities into said implant mask wherein said impurities pass through said first portion of said implant mask and wherein said impurities do not pass through said second portion of said implant mask; wherein said step of forming said implant mask comprises the steps of:

depositing a photoresist over said upper surface of said substrate; and patterning said photoresist using defocused light.

11. A method of forming a semiconductor device from a substrate, said substrate having a first semiconductor region, said method comprising the steps of:

forming an implant mask having a first portion and a second portion over an upper surface of said substrate, said first portion overlain a first portion of said first semiconductor region, said first portion having a sloped surface; and implanting impurities into said implant mask wherein said impurities pass through said first portion of said implant mask and wherein said impurities do not pass through said second portion of said implant mask; wherein said step of forming said implant mask comprises the steps of:

depositing a first layer over said upper surface of said substrate;

depositing a photoresist over said first layer;

patterning said photoresist to form a photoresist mask and expose a portion of said first layer;

etching said exposed portion of said first layer isotropically to form said implant mask having said sloped surface; and stripping said photoresist mask.

12. The method of claim 11 wherein said first layer is selected from the group consisting of oxide, nitride, phosphosilicate glass (PSG), polysilicon and a combination thereof.

13. A method of forming a semiconductor device from a substrate, said substrate having a first semiconductor region, said method comprising the steps of:

forming an implant mask having a first portion and a second portion over an upper surface of said substrate, said first portion overlying a first portion of said first semiconductor region, wherein said implant mask is formed from a first layer and a second layer and wherein said first portion of said implant mask comprises said first layer and said second portion of said implant mask comprises said first layer and said second layer; and implanting impurities into said implant mask wherein said impurities pass through said first portion of said implant mask and do not pass through said second portion of said implant mask.

14. The method of claim 13 wherein said first layer is photoresist and said second layer is selected from the group consisting of oxide, nitride, phosphosilicate glass (PSG), polysilicon and a combination thereof.

15. The method of claim 13 further comprising the steps of:

depositing an oxide layer over said substrate;

depositing a photoresist over said oxide layer;

patterning said photoresist to form a photoresist mask which exposes a portion of said oxide layer; and etching said exposed portion of said oxide layer anisotropically and then isotropically thereby leaving a portion of said photoresist mask overhanging, said overhanging portion of said photoresist mask forming said first portion of said implant mask.

16. The method of claim 13 further comprising the steps of:

depositing an oxide layer over said substrate;

depositing a photoresist over said oxide layer;

patterning said photoresist to form a photoresist mask which exposes a portion of said oxide layer;

removing said exposed portion of said oxide layer by performing an anisotropic etch to form a patterned oxide layer; and removing a portion of said photoresist mask thereby exposing a portion of said patterned oxide layer, said exposed portion of said patterned oxide layer forming said first portion of said implant mask.

17. A method of forming a semiconductor device from a substrate, said substrate having a first semiconductor region, said method comprising the steps of:

forming an implant mask having a first portion and a second portion over an upper surface of said substrate, said first portion overlying a first portion of said first semiconductor region; and implanting impurities into said implant mask wherein said impurities pass through said first portion of said implant mask and wherein said impurities do not pass through said second portion of said implant mask, wherein said first semiconductor region has a first conductivity type and said impurities are of said first conductivity type, and wherein said substrate has a fourth semiconductor region of a second conductivity type opposite said first conductivity type adjacent to said first portion of said first semiconductor region.

18. A method of forming a semiconductor device from a substrate, said substrate having a first semiconductor region, said method comprising the steps of:

forming an implant mask having a first portion and a second portion over an upper surface of said substrate, said first portion overlying a first portion of said first semiconductor region, wherein said first portion of said implant mask has a concave or convex surface; and implanting impurities into said implant mask wherein said impurities pass through said first portion of said implant mask and wherein said impurities do not pass through said second portion of said implant mask.

19. A method of forming a semiconductor device from a substrate, said substrate having a first semiconductor region of a first conductivity type and a second semiconductor region of a second conductivity type opposite said first conductivity type adjacent to said first semiconductor region, said method comprising the steps of:

forming a first implant mask having a first portion and a second portion over said substrate, said first portion overlying a first portion of said first semiconductor region and said second portion overlying said second semiconductor region;

performing a first high energy implantation wherein first conductivity type impurities pass through said first portion of said first implant mask to form a third semiconductor region in said first portion of said first semiconductor region;

stripping said first implant mask;

forming a second implant mask having a first portion overlying a first portion of said second semiconductor region and a second portion overlying said first semiconductor region; and performing a second high energy implantation wherein second conductivity type impurities pass through said first portion of said second implant mask to form a fourth semiconductor region in said first portion of said second semiconductor region.

20. The method of claim 19 wherein, during said step of performing said first high energy implantation, first conductivity type impurities are implanted into a second portion of said first semiconductor region to form a fifth semiconductor region.

21. The method of claim 20 wherein said third semiconductor region and said fifth semiconductor region have substantially uniform dopant concentrations.

22. The method of claim 20 wherein, during said step of performing said second high energy implantation, second conductivity type impurities are implanted into a second portion of said second semiconductor region to form a sixth semiconductor region.

23. The method of claim 22 wherein said fourth semiconductor region and said sixth semiconductor region have substantially uniform dopant concentrations.

24. A method of forming a semiconductor device comprising the steps of:

forming a mask over a semiconductor substrate, said mask having an edge which defines a first portion of said semiconductor substrate which is covered by said mask and a second portion of said semiconductor substrate which is not covered by said mask, wherein a first portion of said mask adjacent to said edge has a first permeability to implanted ions and a second portion of said mask laterally separated from said edge has a second permeability to implanted ions, said first permeability being greater than said second permeability; and selectively implanting impurity ions along a side boundary of a well region of said semiconductor substrate through said first portion of said mask.

25. A method of forming a semiconductor device from a substrate comprising the steps of:

forming a mask over a top surface of said substrate, said mask covering a first portion of said substrate and leaving a second portion exposed;

performing a first ion implantation wherein first impurity ions enter said second portion thereby forming a first semiconductor region; and performing a second ion implantation wherein said impurity ions pass through a first portion of said mask and wherein said impurity ions enter said second portion of said substrate thereby forming a second semiconductor region having a substantially uniform dopant concentration greater than a dopant concentration of said first semiconductor region.

26. The method of claim 25 wherein, during said step of performing said first ion implantation, said first impurity ions do not pass through said mask.

27. The method of claim 25 wherein said step of performing said second ion implantation is performed with an implant energy greater than an implant energy used during said step of performing said first ion implantation.

28. The method of claim 25 wherein said second semiconductor region is continuous with said first semiconductor region.

29. The method of claim 28 wherein said first semiconductor region and said second semiconductor region have a first conductivity type.

30. The method of claim 29 wherein said substrate has a second conductivity type opposite said first conductivity type.

31. The method of claim 25 wherein, during said step of performing said first ion implantation, said first impurity ions pass through said first portion of said mask.

* * * * *

UNITED STATES PATENT AND TRADEMARK OFFICE
CERTIFICATE OF CORRECTION

PATENT NO.     : 6,017,785
DATED          : January 25, 2000
INVENTOR(S)    : Chung-Chyung Han et al.

Page 1 of 1

It is certified that error appears in the above-identified patent and that said Letters Patent is hereby corrected as shown below:

<u>Title page,</u>
Item [75], should read:

-- [75]  Inventors: Chung-Chyung Han, San Jose; Jeong Yeol Choi, Fremont; Chuen-Der Lien, Los Altos Hills, all of Calif. --

Signed and Sealed this

Eighteenth Day of March, 2003

JAMES E. ROGAN
*Director of the United States Patent and Trademark Office*